US008350737B2

(12) United States Patent
Sanduleanu et al.

(10) Patent No.: US 8,350,737 B2
(45) Date of Patent: Jan. 8, 2013

(54) FLASH ANALOG TO DIGITAL CONVERTER WITH METHOD AND SYSTEM FOR DYNAMIC CALIBRATION

(75) Inventors: Mihai A. T. Sanduleanu, Yorktown Heights, NY (US); Jean-Oliver Plouchart, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 13/004,883

(22) Filed: Jan. 12, 2011

(65) Prior Publication Data
US 2012/0176259 A1 Jul. 12, 2012

(51) Int. Cl.
*H03M 1/10* (2006.01)
(52) U.S. Cl. ........ 341/120; 341/118; 341/121; 341/143; 341/155
(58) Field of Classification Search .......... 341/118–122, 341/143, 155
See application file for complete search history.

(56) References Cited

U.S. PATENT DOCUMENTS

| | | | | |
|---|---|---|---|---|
| 5,861,829 A | * | 1/1999 | Sutardja | 341/122 |
| 5,990,814 A | | 11/1999 | Croman et al. | 341/118 |
| 6,084,538 A | | 7/2000 | Kostelnik et al. | 341/120 |
| 6,281,818 B1 | | 8/2001 | Miller | 341/120 |
| 6,346,907 B1 | * | 2/2002 | Dacy et al. | 341/169 |
| 6,369,744 B1 | | 4/2002 | Chuang | 341/161 |
| RE37,716 E | | 5/2002 | Sutardja et al. | 341/120 |
| 6,411,233 B1 | * | 6/2002 | Sutardja | 341/120 |
| 6,603,416 B2 | * | 8/2003 | Masenas et al. | 341/120 |
| 6,799,131 B1 | * | 9/2004 | Steiner et al. | 702/107 |
| 7,400,280 B2 | | 7/2008 | Kushner et al. | 341/120 |
| 7,589,650 B2 | | 9/2009 | Hsien et al. | 341/118 |
| 7,994,960 B1 | * | 8/2011 | Li | 341/158 |
| 2008/0150772 A1 | | 6/2008 | Cao et al. | 341/120 |
| 2009/0195424 A1 | * | 8/2009 | Van Der Plas et al. | 341/120 |
| 2010/0194620 A1 | * | 8/2010 | Kijima | 341/159 |
| 2011/0309961 A1 | * | 12/2011 | Danjo | 341/120 |
| 2012/0188109 A1 | * | 7/2012 | Sanduleanu et al. | 341/120 |
| 2012/0212359 A1 | * | 8/2012 | Lai et al. | 341/120 |

OTHER PUBLICATIONS

Ying-Zu Lin et al., "A 5-bit 3.2-GS/s Flash ADC With a Digital Offset Calibration Scheme" IEEE Transactions on Very Large Scale Integration (VLSI) Systems (2009) pp. 1-5.
Chun-Cheng Huang et al., "A Statistical Background Calibration Technique for Flash Analog-To-Digital Converters" ISCAS 2004 pp. I-125 to I-128.
Hairong Yu et al., "A 1-V 1.25-GS/S 8-Bit Self-Calibrated Flash ADC in 90-nm Digital CMOS", IEEE Transactions on Circuits and Systems-II: Express Briefs, vol. 55, No. 7, Jul. 2008 pp. 668-672.

\* cited by examiner

*Primary Examiner* — Linh Nguyen
(74) *Attorney, Agent, or Firm* — Ido Tuchman; Anne V. Dougherty

(57) ABSTRACT

A flash analog to digital converter and a method and system for dynamically calibrating the flash analog to digital converter. The analog to digital converter may include a track and hold circuit and a plurality of comparators. The analog to digital converter may also include an under-sampling circuit configured to convert a digitized reference signal into an under-sampled digitized reference signal with a frequency of the calibration frequency divided by a positive number M. The under-sampling circuit may be further configured to calibrate a subsequent signal based on the under-sampled digitized reference signal.

20 Claims, 10 Drawing Sheets

902

```
Convert an original digital reference
signal to an analog reference signal
904
```
↓
```
Sample the analog reference
signal at the track and hold circuit
906
```
↓
```
Convert the sampled analog reference signal to a digitized
reference signal by the plurality of analog comparators
908
```
↓
```
Convert the digitized reference signal to an
under-sampled digitized reference signal
910
```
↓
```
Compare the under-sampled digitized reference
signal to the original digital reference signal
912
```
↓
```
Adjust a subsequent signal before it is
received by the plurality of comparators
914
```

FIG. 9

FLASH ANALOG TO DIGITAL CONVERTER WITH METHOD AND SYSTEM FOR DYNAMIC CALIBRATION

BACKGROUND

This invention involves analog to digital conversion. More specifically, the invention relates to a flash digital to analog converter along with the dynamic calibration thereof.

Certain elements of a circuit configured for analog to digital conversion of a signal may introduce nonlinearities into the signal. Elements that may introduce non-linearity into the signal include: track and hold circuits, comparators, and other devices. Systems may also experience thermal and aging effects during usage of the converter.

BRIEF SUMMARY

An example embodiment of the present invention is a method for dynamically calibrating a flash analog to digital converter. The analog to digital converter may include a track and hold circuit and a plurality of comparators. The example method may include a first converting step of converting an original digital reference signal to an analog reference signal, which is oscillating between a first analog voltage and a second analog voltage at a calibration frequency. The example method may further include a sampling step of sampling the analog reference signal at the track and hold circuit. The method may further include a second converting step of converting the sampled analog reference signal to a digitized reference signal by the plurality of analog comparators. The example method may further include a third converting step of converting the digitized reference signal to an under-sampled digitized reference signal. The under-sampled digitized signal may be under-sampled at the calibration frequency divided by M, where M is a positive number. The example method may further include a comparing step of comparing the under-sampled digitized reference signal to the original digital reference signal. The example method may also include an adjusting step of adjusting a subsequent signal before it is received by the plurality of comparators based on the differences in the original digital reference signal and the under-sampled digitized reference signal.

Another example embodiment of the present invention is a system configured to dynamically calibrate a flash analog to digital converter. The example system may include a digital to analog conversion circuit configured to convert an original digital reference signal to an analog reference signal, which is oscillating between a first analog voltage and a second analog voltage at a calibration frequency. The system may include a track and hold circuit configured to sample the analog reference signal. The system may include a plurality of comparators configured to convert the analog reference signal to a digitized reference signal. The system may include an under-sampling circuit configured to convert the digitized reference signal into an under-sampled digitized reference signal with a frequency of the calibration frequency divided by M, where M is a positive number. The system may also include a calibration circuit configured to adjust a subsequent signal before it is received by the plurality of comparators based on the differences between the original digital reference signal and the under-sampled digitized reference signal.

Yet another example embodiment of the invention is a flash analog to digital converter. The analog to digital converter may include a track and hold circuit configured to sample an analog reference signal, which is oscillating between a first analog voltage and a second analog voltage at a calibration frequency. The digital to analog converter may include a plurality of comparators configured to convert the analog reference signal to a digitized reference signal. The analog to digital converter may include an under-sampling circuit configured to convert the digitized reference signal into an under-sampled digitized reference signal with a frequency of the calibration frequency divided by a positive number M. The under-sampling circuit may be further configured to calibrate a subsequent signal based on the under-sampled digitized reference signal.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 9 shows an example embodiment of a method for dynamically calibrating a flash analog to digital converter.

DETAILED DESCRIPTION

The present invention is described with reference to embodiments of the invention. Throughout the description of the invention reference is made to FIGS. 1-10.

As discussed in detail below, embodiments of the present invention include a flash analog to digital converter along with a method and system for dynamically calibrating a flash analog to digital converter.

Figure 1:
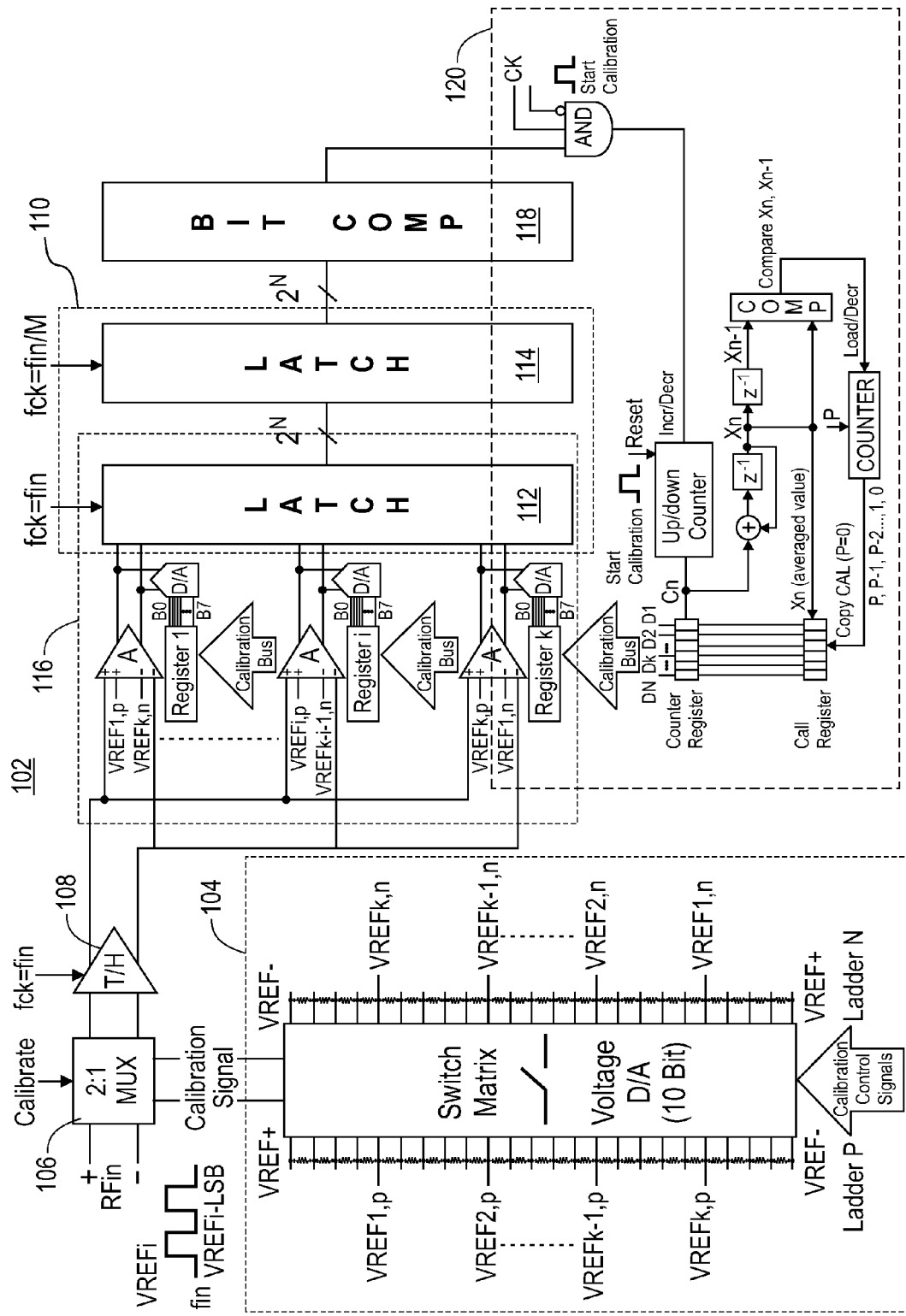
FIG. 1 shows an example embodiment of a system configured to dynamically calibrate a flash analog to digital converter.

FIG. 1 shows an example embodiment of a system 102 configured to dynamically calibrate a flash analog to digital converter. The example system 102 may include a digital to analog conversion circuit 104 configured to convert an original digital reference signal to an analog reference signal, which is oscillating between a first analog voltage and a second analog voltage at a calibration frequency. In one embodiment the digital to analog conversion circuit 104 may include a voltage ladder and a switch matrix.

In one embodiment, the example system 102 may include a multiplexer circuit 106 configured to receive a source signal and the analog reference signal. The multiplexer circuit 106 may transmit the analog reference signal during dynamic calibration and transmit the source signal when the analog to digital converter is not being dynamically calibrated. In one embodiment, the multiplexer circuit 106 may be a 2:1 linear analog multiplexer. The multiplexer circuit 106 may be integrated with other elements of the system such as the track and hold circuit 108 discussed below.

The example system 102 may also include a track and hold circuit 108 configured to sample the analog reference signal. The track and hold circuit 108 may be a differential track and hold that allows for digital gain control and linear buffering. In one embodiment, the track and hold may include a built in linear 2:1 multiplexer as mentioned above. The track and hold may be able to handle different full scale input signals for different standards. An example track and hold circuit may be able to handle large differential signals (greater than 1 Vpp) and have a low voltage operation (roughly 1 V).

Figure 2:
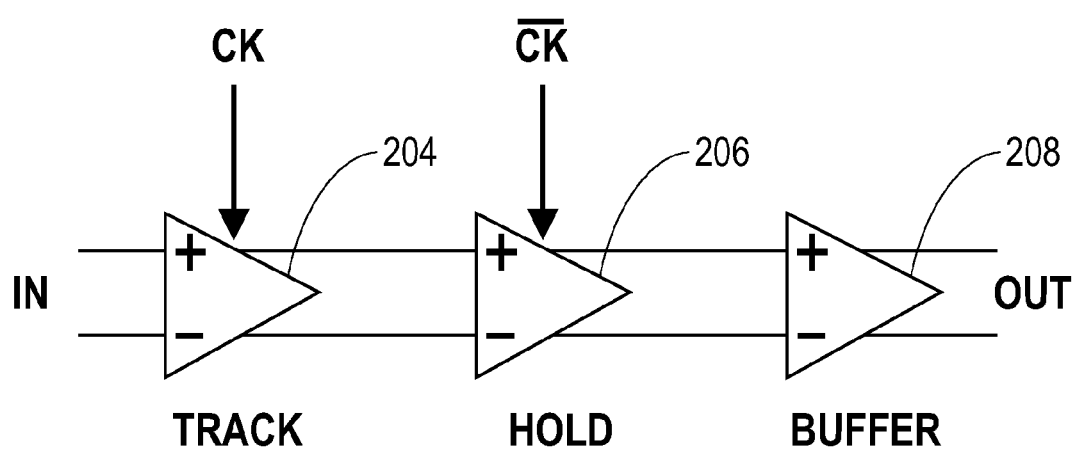
FIG. 2 shows an example track and hold circuit with three stages.
Figure 3:
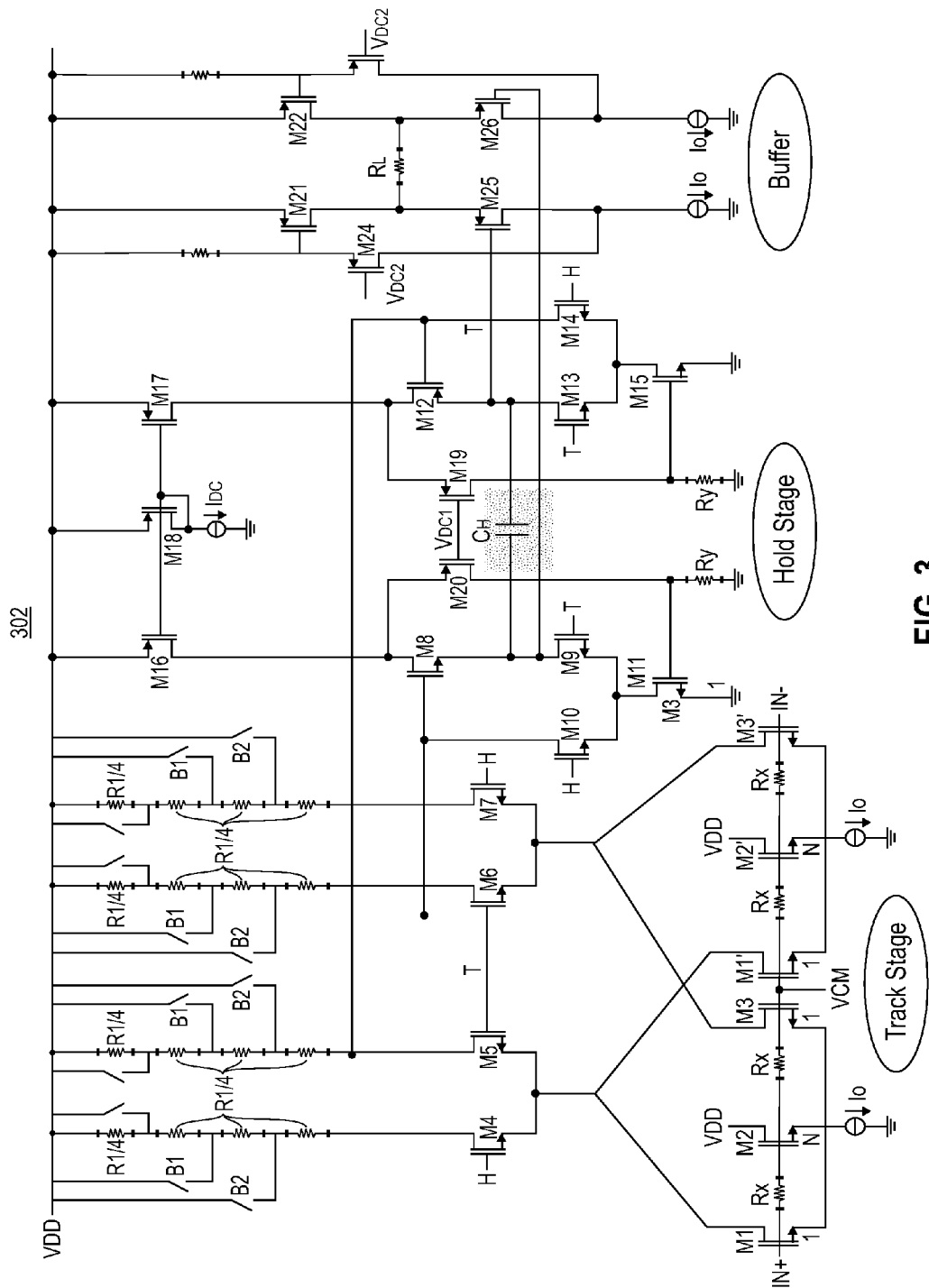
FIG. 3 shows a detailed circuit diagram for the example track and hold circuit of FIG. 2.

FIG. 2 shows an example track and hold circuit 202 with three stages in sequence including a track stage 204, hold stage 206, and buffer stage 208. FIG. 3 shows an example detailed circuit schematic 302 for the track and hold circuit.

The output of the track and hold circuit 108 may be an analog reference signal that includes the nonlinear effects of the track and hold. In other words, the analog reference signal may appear as the result of the clock sampled at the same constant value while taking into account dynamic effects.

The example system 102 may further include a plurality of comparators configured to convert the analog reference signal to a digitized reference signal. The plurality of comparators may be part of the under-sampling circuit 110. As shown in FIG. 1, the example system 102 may further include an under-sampling circuit 110 configured to convert the digitized reference signal into an under-sampled digitized reference signal, which may have a frequency of the calibration frequency divided by M, where M is a positive number. In one embodiment of the example system 102, the under-sampling circuit 110 may include one or more latch circuits 112. These latch circuits 112 may include at least one latch circuit 114 that samples the digitized reference signal at a frequency of the calibration frequency divided by M.

In one embodiment, the analog reference signal may be received by a plurality of conversion slices 116. There may be one slice to convert the analog reference signal by increments of the least significant bit ("LSB"). Each slice may be followed by the latch circuit 114.

Figure 4:
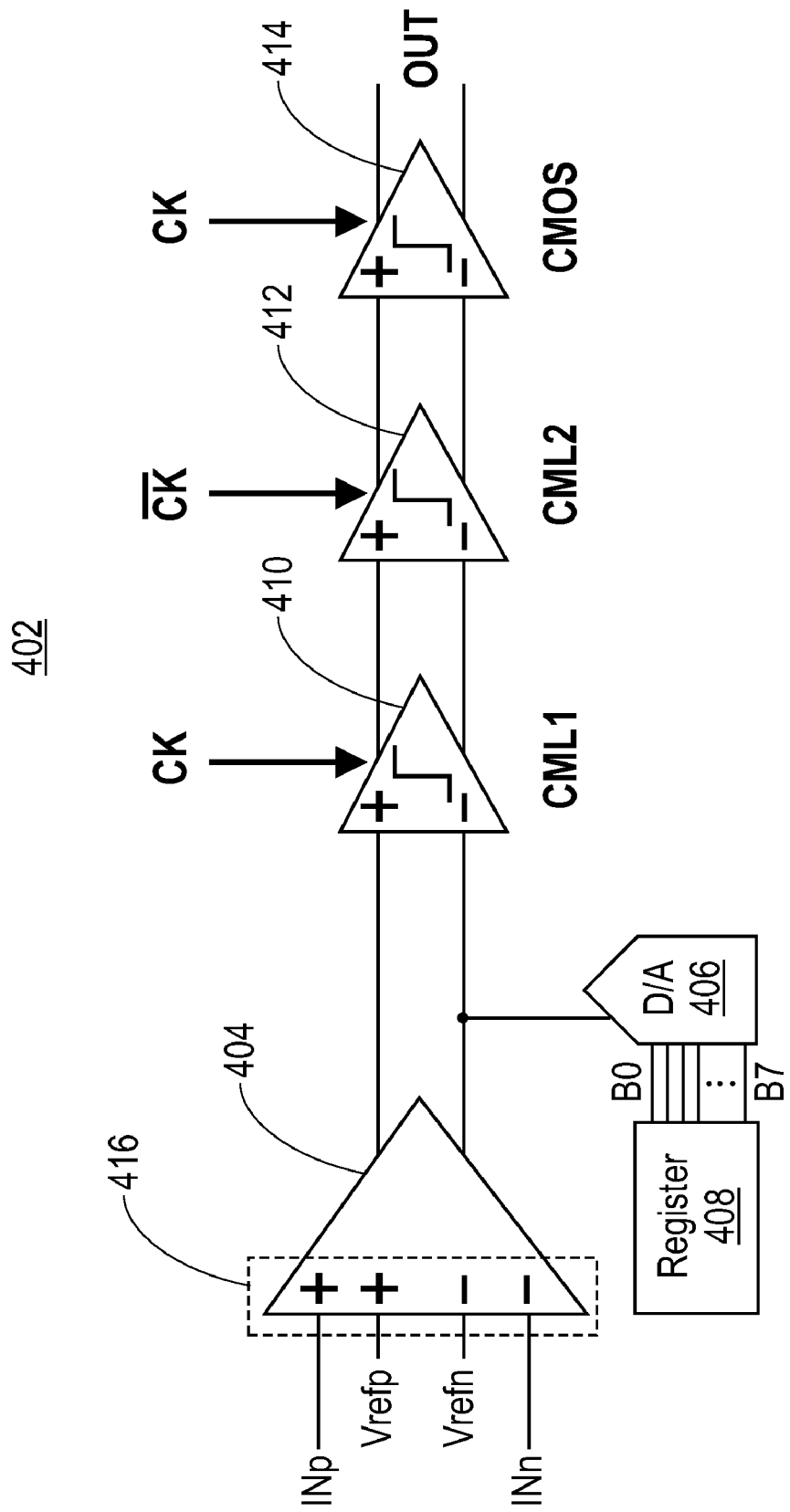
FIG. 4 shows an example embodiment of a slice.

FIG. 4 shows an example embodiment of a slice 402 with a pre-amplifier 404, calibration digital to analog converter 406 with a register 408, first latch-comparator 410, second latch-comparator 412, and CMOS latch 414. The pre-amplifier 404 may include inputs 416 for receiving a positive signal ("INp") and a negative signal ("INn"). The pre-amplifier 404 may also include inputs 416 for a positive reference voltage ("VREFp") and negative reference voltage ("VREFn"). The output of the pre-amplifier 404 may be according to the following formula: [(INp−INn)−(VREFp−VREFn)]*gain. In other words, the pre-amplifier 404 returns the difference between the amplitude of the differential signal and the amplitude of the reference voltages. This difference may be a positive or negative signal amplified by a gain factor. In one embodiment, the output of the pre-amplifier 404 may be modified by a calibration digital to analog converter 406 described below. The output may be received by the first latch-comparator 410, which may include least one comparator from the plurality of comparators.

In one embodiment, each slice 402 may include three successive latches: a first (CML1) latch-comparator 410 with low voltage swing, a second (CML2) latch-comparator 412 with large voltage swing, and a CMOS latch 414 with dummy input. The CML1 latch-comparator 410 may match the pre-amplifier 404 common-mode levels, and may require low voltage swing clock signals. The CML1 latch-comparator 410 may function as both a comparator and latch. The comparator of the CML1 latch-comparator 410 may compare the analog reference signal to a reference voltage supplied by a voltage ladder and output a digital signal of value one or a zero according to whether the difference is positive or negative.

The digital signal may then be sampled at the calibration frequency by the latch from the CML1 latch-comparator 410. The CML2 latch-comparator 412 may require rail-to-rail clock signals, and be able to directly drive a CMOS rail-to-rail latch for differential to single-ended conversion. The CMOS latch 414 may perform differential to single-ended conversion, and may include two anti-phase clocked inverters and a clocked inverter. The CML latch 414 may be followed by the at least one latch circuit 114 that may sample the output of the CML latch 414 at a frequency rate of the calibration frequency divided by M, where M is a positive number.

Figure 5:
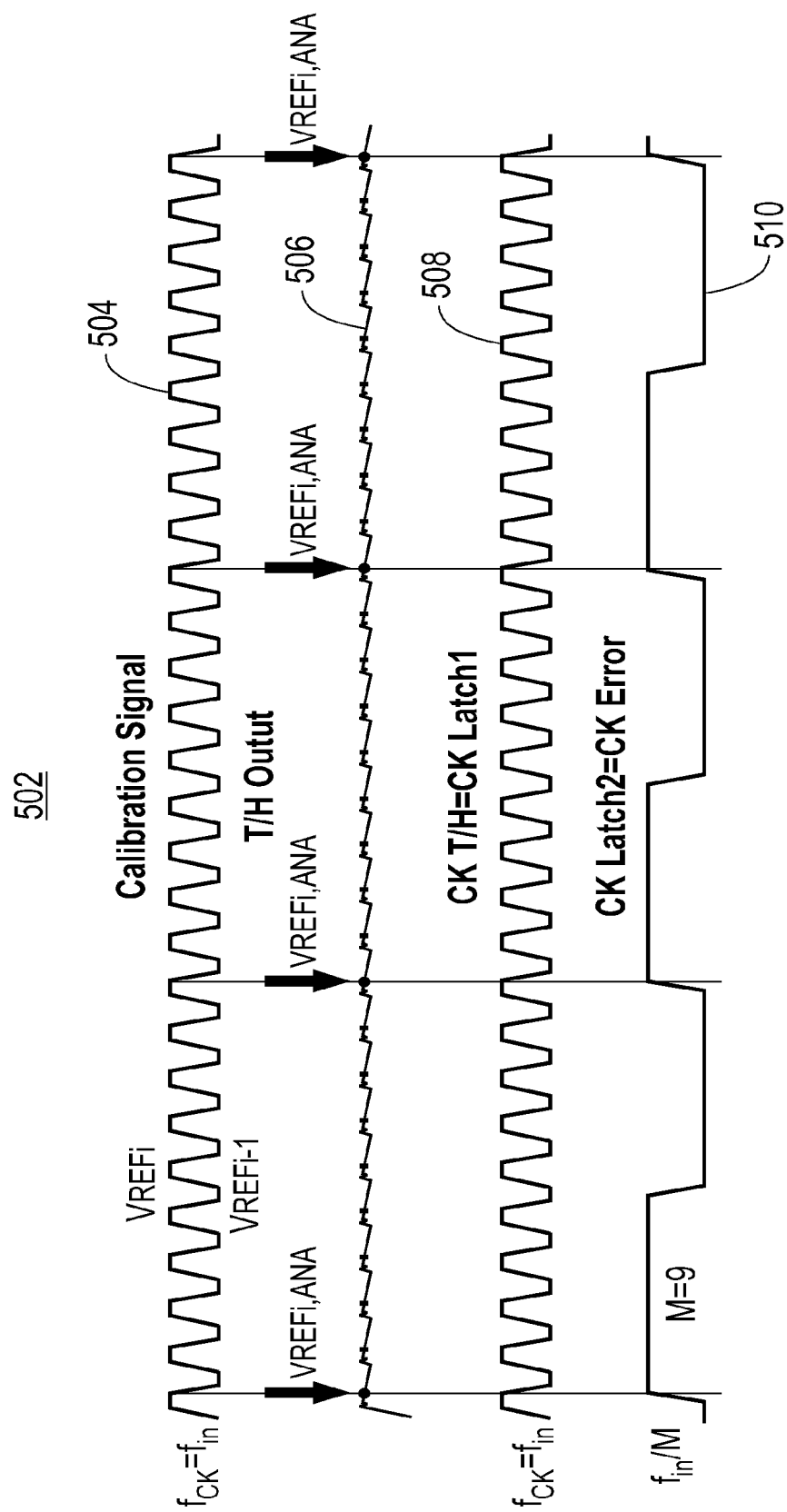
FIG. 5 shows an example representation of signals at various points in an embodiment of the example system of FIG. 1.

FIG. 5 shows an example representation of signals 502 at various points in an embodiment of the system 102. It demonstrates that the analog reference signal output by the track and hold circuit repeats itself at the calibration frequency after steady-state is reached. This figure shows an example representation 502 of a signal at various stages of the calibration: the original digital calibration signal 504, the analog reference signal 506 from the output of the track and hold circuit, the digitized reference signal 508 at the output of the CMOS latch, and the under-sampled digitized reference signal 510 at the output of the at least one latch circuit that samples at the calibration frequency divided by M. Because the voltage of the reference signal may be relatively constant, it may be a good approximation to under-sample the signal. Hence we can re-sample this reference signal at a frequency rate of the calibration frequency divided by M.

As shown in FIG. 1, the example system 102 may further include a calibration circuit 120 configured to adjust a subsequent signal before it is received by the comparators based on the differences between the original digital reference signal and the under-sampled digitized reference signal. In one embodiment of the example system 102, the calibration circuit 120 may include a plurality of calibration digital to analog conversion circuits configured to send a calibration signal to alter any signal sent to the plurality of comparators before the signal is received by the comparators.

Prior to dynamic calibration a static calibration may be performed as described below. The calibration circuit may work at much lower frequency than the sample rate of the analog to digital converter. As a consequence, the error may be under-sampled, and thus, the digital algorithm may have no speed limitations. The calibration calibration may be repeated for each slice and each reference level of the comparators.

The calibration signal may be a square-wave signal bouncing between two values (VREFi and VREFi-LSB) with an amplitude of 1 LSB and at a Nyquist frequency. The calibration signal may be generated from a voltage ladder and a switch matrix. The output of the track and hold circuit may be a signal that has all the nonlinear effects created by the track and hold or other elements of the circuit. The clock may sample the same constant value but taking into account dynamic effects. This value may be sampled by the CML1 latch-comparator, CML2 latch-comparator, and the CMOS latch at the calibration frequency. The latch 114 may sample the output of the CMOS latch at a frequency of the calibration frequency divided by M, where M is a positive number. After sampling by the latch 114, a bit comparator 118 may compare the output of the at least one latch 114 with the digital reference signal that may be present as a digital code at the switches of the calibration ladder.

Figure 6:
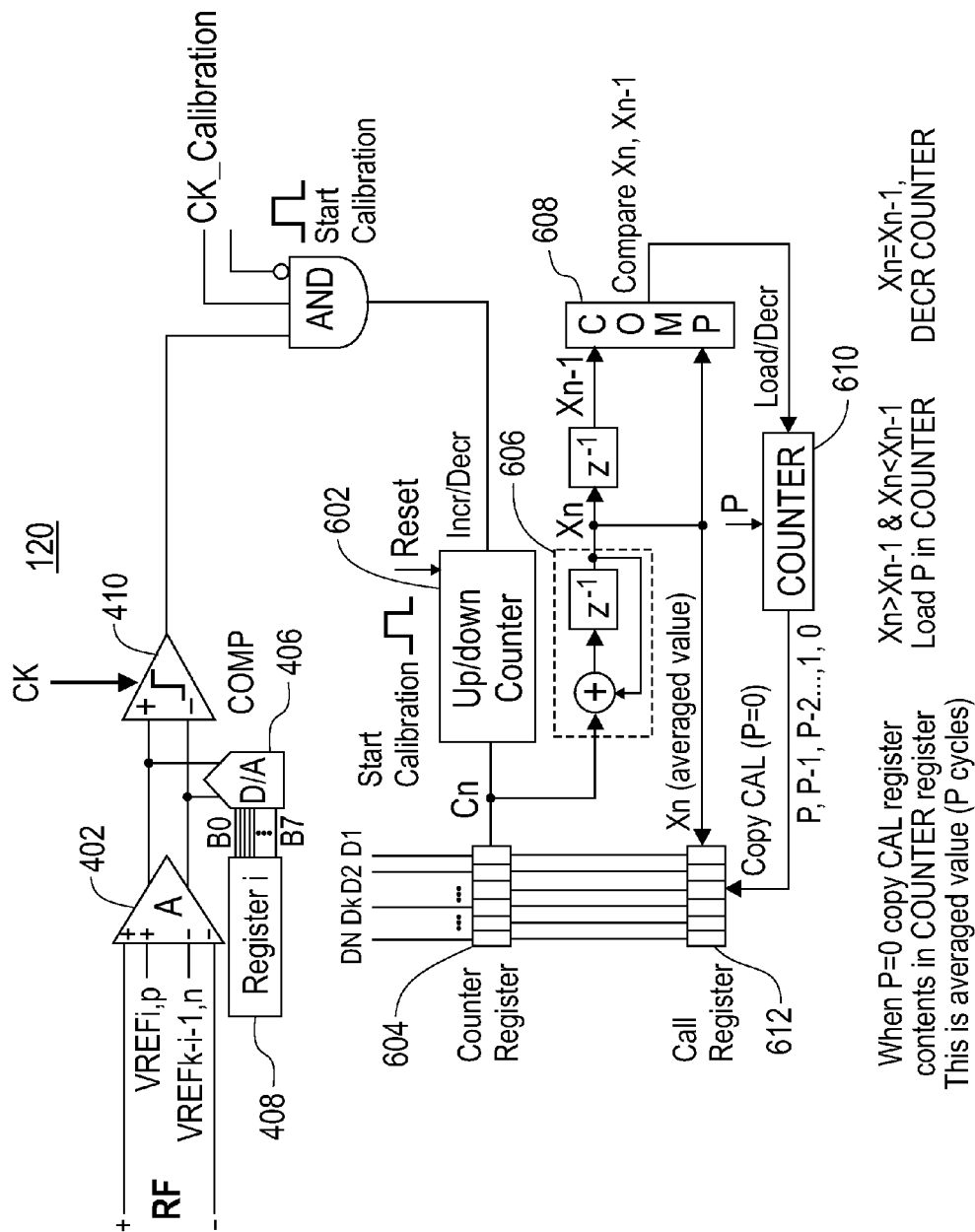
FIG. 6 shows a detailed view of an example embodiment of a calibration circuit.

FIG. 6 shows a detailed view of an example embodiment of a calibration circuit 120. The calibration circuit 120 may receive a start calibration signal when the time for calibration has arrived. After the start calibration signal is active, the UP/DOWN counter 602 may start to increment its output value Cn after each clock cycle. The value of Cn may be entered into the counter register 604. After Cn is incremented up to the tripping level of the comparator, averaging of Cn may occur through an averaging circuit 606. The averaging circuit 606 may include an accumulator delay circuit with an output of Xn, where Xn is an averaged value of Cn. Next, in a comparing circuit 608, Xn may then be compared with Xn-1, where Xn-1 is a previous averaged value of Cn. Following the comparing circuit 608 may be an averaging counter 610 that may be pre-loaded with the value P, where P is the number of cycles over which averaging takes place. If Xn=Xn-1, the value of the counter, P, may be decremented by an integer value.

When the value of the averaging counter 610 is P=0, the value contained in the CAL register 612 may represent the averaged value Xn, and it may be copied to the counter register 604 connected to the register 408 and calibration digital to analog converters 406. The value of Xn that is copied may become a fixed value in the counter register 604, preventing override by any subsequent Cn values. At that point, the calibration of the slice may be complete. According to the value fixed in the register 408, the calibration digital to analog converters 406 may inject positive or negative current into the analog reference signal between the pre-amplifier 402 and the comparator 410 to adjust any signals being converted by the analog to digital converter.

Figure 7:
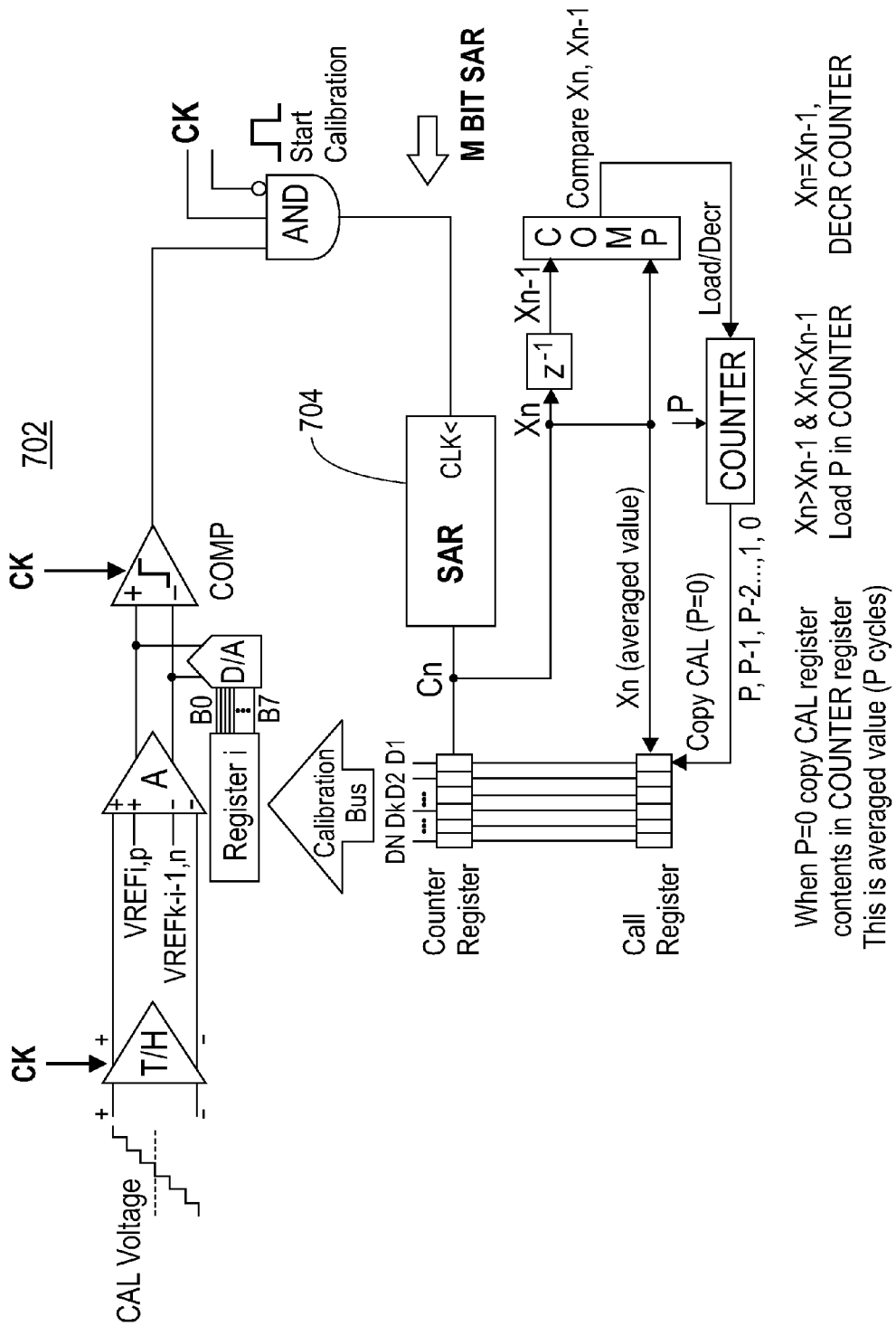
FIG. 7 shows a detailed view of another embodiment of a calibration circuit that uses a successive approximation and averaging algorithm.

FIG. 7 shows a detailed view of another embodiment of a calibration circuit 702, in which a successive approximation and averaging algorithm is used. Similar to the previous example calibration circuit, the same ramp signal may be generated before the input of the track and hold circuit during calibration and used to calibrate each slice separately. An example formula representing a successive approximation algorithm is $VCAL_{i,k}=VCAL_{i,k-1}-sgn[VCAL_{i,k-1}-VCAL_i]/2^k$ where sgn[ ] is the sign (also called signum) function. In other words, in each round of approximation, a new approximation (the kth approximation) is found by subtracting from the value of the previous approximation the result of the signum function divided by two raised to the kth power, where k is the current iteration number of the approximation and where the signum function takes as its argument the reference voltage level to be reached subtracted from the approximation voltage value of the previous iteration.

The successive approximation algorithm may be implemented through a successive approximation counter 704. The successive approximation counter may generate an output value Xn, averaged in the same way as the ramp algorithm. The calibration circuit 702 may further include many of the same circuit elements of the previous embodiment of the calibration circuit as described above.

In one embodiment of the example system 102, the analog to digital converter may be configured to convert a source signal having a source frequency. In such embodiments of the example system 102, the calibration frequency may be higher in frequency than the source frequency. The calibration frequency may be substantially close to the Nyquist frequency ("$f_{NYQUIST}$") divided by 2. The Nyquist frequency is the sample frequency related to the 3 dB bandwidth ("$f_{3dB}$") of the input signal, that is, the Nyquist frequency is equal to the 3 dB bandwidth frequency multiplied by 2 ($f_{NYQUIST}=2*f_{3dB}$).

Figure 8:
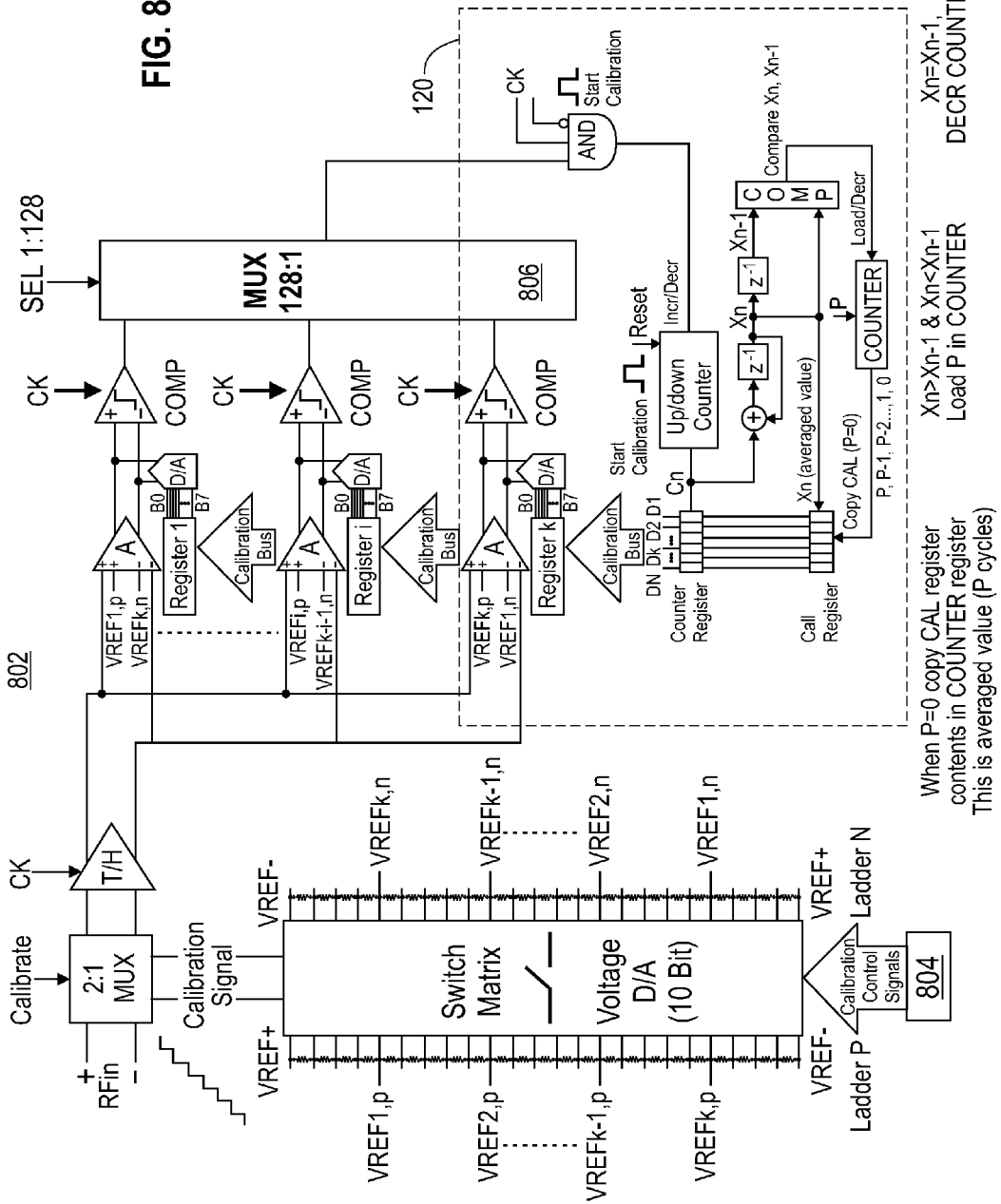
FIG. 8 shows an example embodiment of a system that may be similar to the system of FIG. 1 but configured for static calibration.

FIG. 8 shows an example embodiment of a system 802 that may be similar to system 102 but further may include a controller 804 configured to generate the original digital reference signal at the tripping voltage of a comparator being calibrated and send the original digital reference signal to the digital to analog conversion circuit. Though not shown, example system 102 of FIG. 1 may also include the controller 802. As discussed above, an embodiment of the system 102 and system 802 may include a plurality of slices, each slice containing at least one comparator with a distinct tripping voltage. The tripping voltage is the voltage needed for the comparator to output a digital signal of 1 rather than 0. In one embodiment, each slice may be calibrated one slice at a time.

In the example embodiment of system 802, the controller 804 and calibration circuit 120 may also be configured to statically calibrate the analog to digital converter. In one embodiment, example system 802 may further include a calibration multiplexer 806. The calibration multiplexer 806 may be configured to allow transmission to the calibration circuit 120 of the digitized reference signal from one or more of the comparators of the plurality of comparators. Though only the comparators are show in FIG. 8, it is to be understood that in some embodiments the plurality of comparators may be part of one or more latches. In an example embodiment of system 802, the analog to digital converter may be configured to use the calibration multiplexer 806 instead of the under-sampling circuit during static calibration. In one embodiment, static calibration may be achieved on the same calibration circuit as the dynamic calibration. In some embodiments, static calibration may be performed before dynamic calibration. The calibration circuit for static calibration may be the same circuit as the calibration circuit used for dynamic calibration. The calibration circuit is discussed above.

The difference between dynamic and static calibration may be in the use of the calibration multiplexer 806 rather than a bit comparator and under-sampling circuit. During static calibration, the original digital reference signal may be a static signal rather than an oscillating square wave (as may be used in dynamic calibration), and thus, not require under-sampling.

FIG. 9 shows an example embodiment of a method for dynamically calibrating a flash analog to digital converter. The analog to digital converter includes a track and hold circuit and a plurality of comparators. The example method 902 may include a first converting step 904 to convert an original digital reference signal to an analog reference signal. The analog reference signal is oscillating between a first analog voltage and a second analog voltage at a calibration frequency.

The example method 902 may further include a sampling step 906 to sample the analog reference signal at the track and hold circuit. The method may further include a second converting step 908 to convert the sampled analog reference signal to a digitized reference signal by the plurality of analog comparators. The example method 902 may further include a third converting step 910 to convert the digitized reference signal to an under-sampled digitized reference signal. The under-sampled digitized signal may be under-sampled at the calibration frequency divided by M, where M is a positive number. The example method 902 may further include a comparing step 912 to compare the under-sampled digitized reference signal to the original digital reference signal. The example method 902 may also include an adjusting step 914 to adjust a subsequent signal before it is received by the plurality of comparators based on the differences in the original digital reference signal and the under-sampled digitized reference signal. Elements capable of performing the example method are described above.

In example method 902, the analog to digital converter may be configured to convert a source signal having a source frequency. The calibration frequency may be higher in frequency than the source frequency. In example method 902, each comparator may be calibrated one at a time by setting the original digital reference signal at the tripping voltage of the comparator selected for calibration. This may be accomplished by a controller as described above.

In example method 902, the digitized reference signal may be converted to the under-sampled digitized reference signal by one or more latch circuits. The latch circuits may include at least one latch circuit that samples the digitized reference signal at the calibration frequency divided by M. The latch circuits and the at least one latch circuit are described above. In example method 902, the track and hold circuit may be configured to receive the analog reference signal during calibration and to receive a source signal when the analog to digital converter is not being calibrated.

Figure 10:
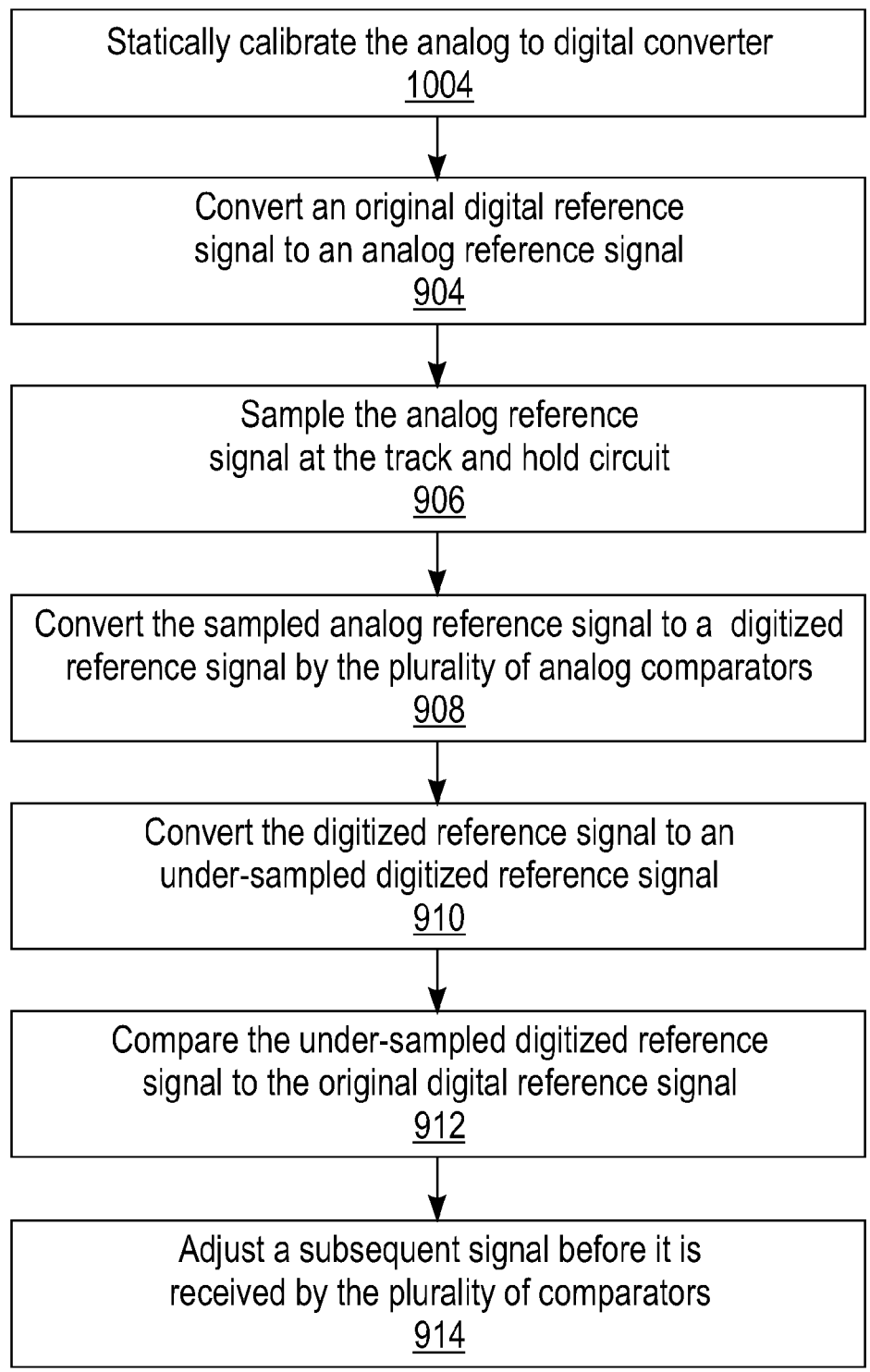
FIG. 10 shows an example embodiment of a method that includes method of FIG. 9 but may further include a static calibration step.

FIG. 10 shows an example embodiment of a method 1002 that includes method 902 but may further include a static calibration step 1004 for statically calibrating the analog to digital converter before converting an original digital reference signal to an analog reference signal. In example method 1002, statically calibrating and adjusting the subsequent signal may be accomplished through the same calibration circuit as described above.

In example method 1002, the calibration circuit may include a plurality of calibration digital to analog conversion circuits, which may be configured to send a calibration signal to alter the subsequent signal sent to the plurality of comparators before the signal is received by the plurality of comparators. This altering may be performed by elements as described above.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The foregoing embodiments and examples were chosen and described in order to best explain the principles of the invention and the practical application, and to enable others of ordinary skill in the art to understand the invention for various embodiments with various modifications as are suited to the particular use contemplated.

What is claimed is:

1. A method for dynamically calibrating a flash analog to digital converter, the analog to digital converter including a track and hold circuit and a plurality of comparators, comprising:

converting an original digital reference signal to an analog reference signal oscillating between a first analog voltage and a second analog voltage at a calibration frequency;

sampling the analog reference signal at the track and hold circuit;

converting the sampled analog reference signal to a digitized reference signal by the plurality of analog comparators;

converting the digitized reference signal to an under-sampled digitized reference signal, the under-sampled digitized signal being under-sampled at the calibration frequency divided by M, where M is a positive number;

comparing the under-sampled digitized reference signal to the original digital reference signal; and adjusting a subsequent signal before it is received by the plurality of comparators based on the differences in the original digital reference signal and the under-sampled digitized reference signal.

2. The method of claim 1, wherein the analog to digital converter is configured to convert a source signal having a source frequency and the calibration frequency is higher in frequency than the source frequency.

3. The method of claim 1, wherein each comparator of the plurality of comparators is calibrated one at a time by setting the original digital reference signal at the tripping voltage of the comparator selected for calibration.

4. The method of claim 1, wherein the digitized reference signal is converted to the under-sampled digitized reference signal by one or more latch circuits, the one or more latch circuits including at least one latch circuit that samples the digitized reference signal at the calibration frequency divided by M.

5. The method of claim 1, further comprising:

statically calibrating the analog to digital converter before converting an original digital reference signal to an analog reference signal.

6. The method of claim 5, wherein statically calibrating and adjusting the subsequent signal are both accomplished through the same calibration circuit.

7. The method of claim 6, wherein the calibration circuit includes a plurality of calibration digital to analog conversion circuits configured to send a calibration signal to alter the subsequent signal sent to the plurality of comparators before the signal is received by the plurality of comparators.

8. The method of claim 1, wherein the track and hold circuit is configured to receive the analog reference signal during calibration and to receive a source signal when the analog to digital converter is not being calibrated.

9. A system configured to dynamically calibrate a flash analog to digital converter, comprising:

a digital to analog conversion circuit configured to convert an original digital reference signal to an analog reference signal oscillating between a first analog voltage and a second analog voltage at a calibration frequency;

a track and hold circuit configured to sample the analog reference signal;

a plurality of comparators configured to convert the analog reference signal to a digitized reference signal;

an under-sampling circuit configured to convert the digitized reference signal into an under-sampled digitized reference signal with a frequency of the calibration frequency divided by M, where M is a positive number; and a calibration circuit configured to adjust a subsequent signal before it is received by the plurality of comparators based on the differences between the original digital reference signal and the under-sampled digitized reference signal.

10. The system of claim 9, wherein the analog to digital converter is configured to convert a source signal having a source frequency and the calibration frequency is higher in frequency than the source frequency.

11. The system of claim 9, wherein the under-sampling circuit includes one or more latch circuits, the one or more latch circuits including at least one latch circuit that samples the digitized reference signal at a frequency of the calibration frequency divided by M.

12. The system of claim 9, further comprising:
a controller configured to generate the original digital reference signal at the tripping voltage of a comparator being calibrated and send the original digital reference signal to the digital to analog conversion circuit.

13. The system of claim 12, wherein the controller and calibration circuit are also configured to statically calibrate the analog to digital converter.

14. The system of claim 13, further comprising:
a calibration multiplexer configured to allow transmission to the calibration circuit of the digitized reference signal from one or more of the comparators of the plurality of comparators;
wherein the analog to digital converter is configured to use the calibration multiplexer instead of the under-sampling circuit during static calibration.

15. The system of claim 9, wherein the calibration circuit includes a plurality of calibration digital to analog conversion circuits configured to send a calibration signal to alter any signal sent to the plurality of comparators before the signal is received by the plurality of comparators.

16. The system of claim 9, further comprising:
a multiplexer circuit configured to receive the source signal and the analog reference signal and transmit the analog reference signal during dynamic calibration and to transmit the source signal when the analog to digital converter is not being dynamically calibrated.

17. A flash analog to digital converter, comprising:
a track and hold circuit configured to sample an analog reference signal oscillating between a first analog voltage and a second analog voltage at a calibration frequency;
a plurality of comparators configured to convert the analog reference signal to a digitized reference signal; and
an under-sampling circuit configured to convert the digitized reference signal into an under-sampled digitized reference signal with a frequency of the calibration frequency divided by a positive number M, wherein the under-sampling circuit is further configured to calibrate a subsequent signal based on the under-sampled digitized reference signal.

18. The flash analog to digital converter of claim 17, wherein the track and hold is configured to sample at the calibration frequency.

19. The flash analog to digital converter of claim 17, wherein the under-sampling circuit includes one or more latch circuits, the one or more latch circuits including at least one latch circuit that samples the digitized reference signal at a frequency of the calibration frequency divided by M.

20. The flash analog to digital converter of claim 17, wherein calibration is accomplished through a plurality of calibration digital to analog conversion circuits configured to send a calibration signal to alter any signal sent to the plurality of comparators before the signal is received by the plurality of comparators.

* * * * *